(12) United States Patent
Kim et al.

(10) Patent No.: US 10,418,429 B2
(45) Date of Patent: Sep. 17, 2019

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: Mi-Seong Kim, Gyeonggi-do (KR); Joung-Woo Lee, Seoul (KR); Se-Jun Cho, Gyeonggi-do (KR); Seung-Hee Kuk, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/036,603

(22) Filed: Jul. 16, 2018

(65) Prior Publication Data

US 2018/0323245 A1 Nov. 8, 2018

Related U.S. Application Data

(62) Division of application No. 15/393,495, filed on Dec. 29, 2016, now Pat. No. 10,026,791.

(30) Foreign Application Priority Data

Dec. 30, 2015 (KR) .................. 10-2015-0190213

(51) Int. Cl.
*H01L 27/32* (2006.01)

(52) U.S. Cl.
CPC ...... *H01L 27/3246* (2013.01); *H01L 27/3216* (2013.01); *H01L 27/3218* (2013.01); *H01L 2227/323* (2013.01)

(58) Field of Classification Search
None
See application file for complete search history.

(56) References Cited

U.S. PATENT DOCUMENTS

| 8,535,975 B2 | 9/2013 | Kim et al. |
| 2006/0081844 A1 | 4/2006 | Hirosue et al. |

(Continued)

FOREIGN PATENT DOCUMENTS

| CN | 1770937 A | 5/2006 |
| JP | 2002-083689 A | 3/2002 |

(Continued)

OTHER PUBLICATIONS

Search Report dated Mar. 16, 2017 from the Intellectual Property Office of the United Kingdom in counterpart UK application No. GB1622136.8.

(Continued)

*Primary Examiner* — Thien F Tran
(74) *Attorney, Agent, or Firm* — Morgan, Lewis & Bockius LLP (57) ABSTRACT

An organic light emitting display device includes a substrate including a plurality of pixels defined thereon; a first electrode disposed at each pixel; a bank exposing the first electrode of each pixel; a spacer including, sequentially on the bank, a first layer of a first negative photoreactive acryl and a second layer of a second negative photoreactive acryl having a greater photoreactivity than a photoreactivity of the first negative photoreactive acryl, wherein the first layer has a negative taper and the second layer has a positive taper; an organic layer on the bank and the first electrode, the organic layer including an organic light emitting layer; and a second electrode on the bank, the spacer, and the organic layer.

4 Claims, 7 Drawing Sheets

(56) References Cited

U.S. PATENT DOCUMENTS

| | | |
|---|---|---|
| 2009/0315458 A1 | 12/2009 | Choi et al. |
| 2012/0256973 A1 | 10/2012 | Choi et al. |
| 2013/0099218 A1* | 4/2013 | Lee .................... H01L 51/5203 257/40 |
| 2014/0117336 A1 | 5/2014 | Kim et al. |
| 2015/0001507 A1* | 1/2015 | Kim .................... H01L 27/3246 257/40 |
| 2015/0097171 A1 | 4/2015 | Kim et al. |
| 2016/0013438 A1 | 1/2016 | Im et al. |

FOREIGN PATENT DOCUMENTS

| | | |
|---|---|---|
| JP | 2007-095342 A | 4/2007 |
| KR | 20080085583 A | 9/2008 |

OTHER PUBLICATIONS

Office Action dated Nov. 17, 2017 from the Taiwan Advance Patent & Trade Office in related Taiwanese application No. 105143197.

\* cited by examiner

ORGANIC LIGHT EMITTING DISPLAY DEVICE AND METHOD OF MANUFACTURING THE SAME

This application is a divisional of the U.S. patent application Ser. No. 15/393,495, filed Dec. 29, 2016, which claims the priority benefit of Korean Patent Application No. 10-2015-0190213, filed on Dec. 30, 2015, both which are incorporated herein by reference as if fully set forth herein.

BACKGROUND

Field of the Invention

The present invention relates to a display device, and more particularly, to an organic light emitting display device and a method of manufacturing the same.

Discussion of the Related Art

As examples of flat display devices, there are a liquid crystal display device (LCD), an organic light emitting display (OLED) device, a plasma display panel (PDP) device, a quantum dot display device, a field emission display (FED) device, an electrophoretic display (EPD) device, etc. Each of these flat display devices includes a flat display panel for displaying an image in which a pair of transparent insulating substrates facing each other is bonded to each other, with an intrinsic light emitting layer, a polarizing layer, or other optical material layers interposed therebetween.

Recently, various demands for a flat display device having low spatial occupation have increased as the size of display devices has increased. Further, there is a need for a flexible type flat display device. Particularly, a separate light source is omitted at the organic light emitting display device because the organic light emitting display device is self-luminous. Therefore, the organic light emitting display device may be used as a flexible display device.

However, the organic light emitting display device uses a metallic mask having an opening corresponding to a deposition part upon deposition of an organic material. When the metallic mask is in contact with a bank defining pixels, bank deflection of particles may occur. To this end, a spacer is formed on the bank such that a surface of the metallic mask does not directly contact with the bank.

However, the flexible organic light emitting display device is subject to repeated folding and unfolding motions. But, when the spacer is provided, there are defects caused by the spacer during folding motions.

SUMMARY

Accordingly, the present invention is directed to a an organic light emitting display device and a method of manufacturing the same that substantially obviates one or more problems due to limitations and disadvantages of the related art.

An object of the present invention is to provide an organic light emitting display device in which a shape of a spacer on a bank is changed to prevent a metallic mask from directly affecting a pixel area upon deposition of an organic material and a contact area between the spacer and the metallic mask is adjusted to prevent defects due to particles, and a method of manufacturing the same.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, an organic light emitting display device comprises a substrate including a plurality of pixels defined thereon; a first electrode disposed at each pixel; a bank exposing the first electrode of each pixel; a spacer including, sequentially on the bank, a first layer of a first negative photoreactive acryl and a second layer of a second negative photoreactive acryl having a greater photoreactivity than a photoreactivity of the first negative photoreactive acryl, wherein the first layer has a negative taper and the second layer has a positive taper; an organic layer on the bank and the first electrode, the organic layer including an organic light emitting layer; and a second electrode disposed on the bank, the spacer, and the organic layer.

In another aspect, a method of manufacturing an organic light emitting display device comprises providing a substrate including a plurality of pixels defined thereon; forming a first electrode at each pixel; forming a bank exposing the first electrode of each pixel; sequentially depositing, on the bank, a first layer of a first negative photoreactive acryl and a second layer of a second negative photoreactive acryl having a greater photoreactivity than a photoreactivity of the first negative photoreactive acryl; forming a spacer including the first layer having a negative taper and the second layer having a positive taper by applying a mask over the second layer, the mask having an open portion to open a predetermined portion of the bank; forming an organic layer including an organic light emitting layer on the bank and the first electrode; and forming a second electrode on the bank, the spacer, and the organic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. Names of components used in the following description may be selected in consideration of facility of specification preparation. Thus, the names of the components may be different from names of components used in a real product.

Figure 1:
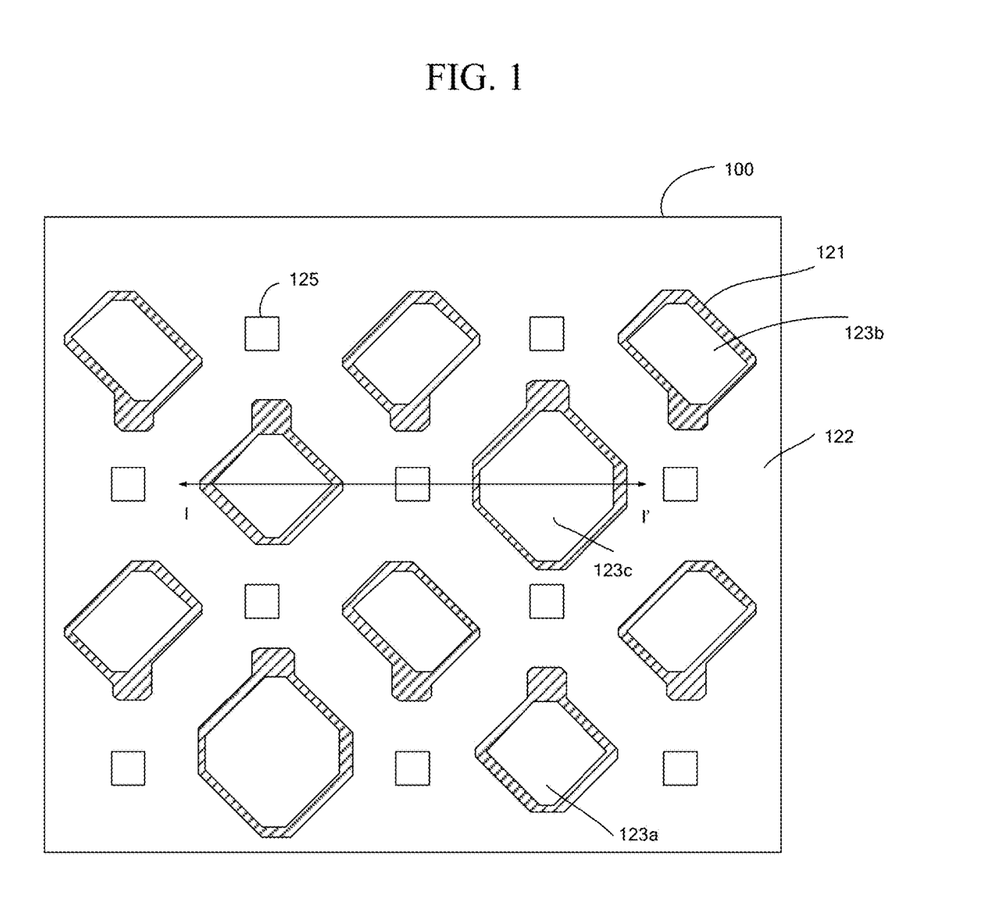
FIG. 1 is a plan view of an organic light emitting display device in accordance with an embodiment of the present invention.
Figure 2:
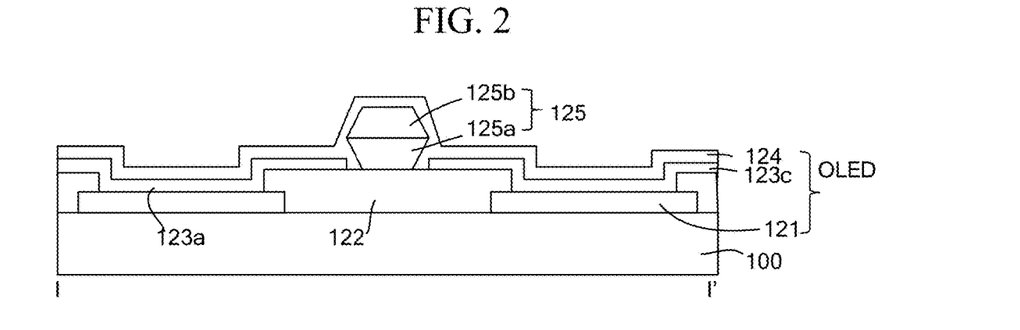
FIG. 2 is a cross-sectional view of FIG. 1.
Figure 3:
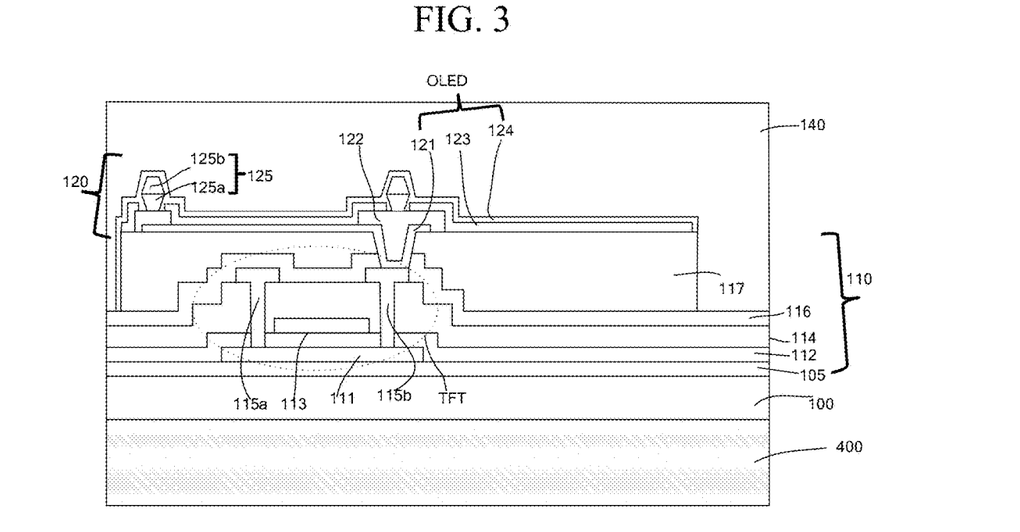
FIG. 3 is a cross-sectional view illustrating an organic light emitting display device in accordance with an embodiment of the present invention in detail.

FIG. 1 is a plan view illustrating an organic light emitting display device in accordance with an embodiment of the present invention. FIG. 2 is a cross-sectional view of FIG. 1. FIG. 3 is a cross-sectional view illustrating the organic light emitting display device in detail.

As illustrated in FIGS. 1 and 2, the organic light emitting display device may include a substrate 100 having a plurality of pixels arranged in a matrix, a first electrode 121 disposed at each pixel, a bank 122 exposing the first electrode 121, a spacer 125 including a first layer 125a formed of a first photoreactive negative photo acryl while having a negative tapered shape and a second layer 125b formed of a second photoreactive negative photo acryl having greater photoreactivity than photoreactivity of the first layer 125a while having a positive tapered shape, which are sequentially stacked on the bank 122. Organic layers 123a, 123b, and 123c formed on the bank 122 and the first electrode 121. Each organic layer includes an organic light emitting layer. A second electrode 124 is disposed on the bank 122, the spacer 125, and the organic layers 123a, 123b, and 123c.

The pixels illustrated in FIG. 1 are arranged on a plane in a diagonal direction. The organic layers 123a, 123b, and 123c in each of the pixels have different shapes with respect to colors. As luminous efficacy of the organic layers 123a, 123b, and 123c are decreased, sizes of the organic layers 123a, 123b, and 123c are increased. For example, the organic layer 123c having the largest rhombus shape is a blue light emitting layer. The organic layer 123a having a smaller rhombus shape than the organic layer 123c is a red light emitting layer. The organic layer 123b extending in a horizontal direction is a green light emitting layer. Herein, the green light emitting layer 123b has a parallelogram shape. However, it may usually be desired to have a rhombus shape similar to the red light emitting layer 123a. Meanwhile, when the pixels are arranged in a diagonal direction and the spacer 125 is in contact with a deposition mask upon deposition of an organic material, a kind of symmetric force is applied to the entire panel, thereby preventing particles that are concentrated in a specific part and uniformizing luminance distribution.

Herein, each pixel includes an organic light emitting diosde (OLED) including a first electrode 121, an organic layer 123 including an organic light emitting layer, and a second electrode 124. Each pixel includes a circuit configuration including at least two thin film transistors and at least one capacitor for separately driving each organic light emitting display.

In addition, the circuit configuration of each pixel is referred to as a thin film transistor array 110. As illustrated in FIG. 3, the thin film transistor array 110 is arranged below the organic light emitting display. Namely, a TFT buffer layer 105 is disposed on the substrate 100. The thin film transistor array 110 includes a gate line and a data line that intersect each other to divide the pixels, and at least two thin film transistors TFT at each pixel.

A thin film transistor TFT in the pixel of the thin film transistor array 110 includes an active layer 111 on the TFT buffer layer 105, a gate insulating layer 112 formed on the TFT buffer layer 105 to cover the active layer 111, a gate electrode 113 overlapping with the active layer 111, an interlayer insulating layer 114 formed on the gate electrode 113 and the gate insulating layer 112, and a source electrode 115a and a drain electrode 115b passing through the interlayer insulating layer 114 and the gate insulating layer 112 to contact both sides of the active layer 112. Herein, the gate electrode 113 may be disposed at the same level as the gate line. The source electrode 115a and the drain electrode 115b may be disposed at the same level as the data line. In a peripheral region of the thin film transistor array 110, pad electrodes for the gate line and the data line and second electrode pad electrode for the second electrode of an organic light emitting display array 120 are provided to be grounded or to allow a certain voltage to be applied thereto.

Furthermore, the organic light emitting display OLED disposed at each sub-pixel of the organic light emitting display array 120 includes a first electrode 121 connected to the drain electrode 115b, the organic layer 123 including the organic light emitting layer formed in the bank 122 defining a light emitting region, and a second electrode 124 covering the organic layer 123.

Herein, the spacer 125 is disposed on the bank 122. In a deposition process of the organic light emitting material, the spacer 125 prevents the deposition mask formed of metallic elements while having a certain opening from directly being in contact with the bank 122. Thus, collapse of the bank 122 defining the light emitting region may be prevented.

Figure 4:
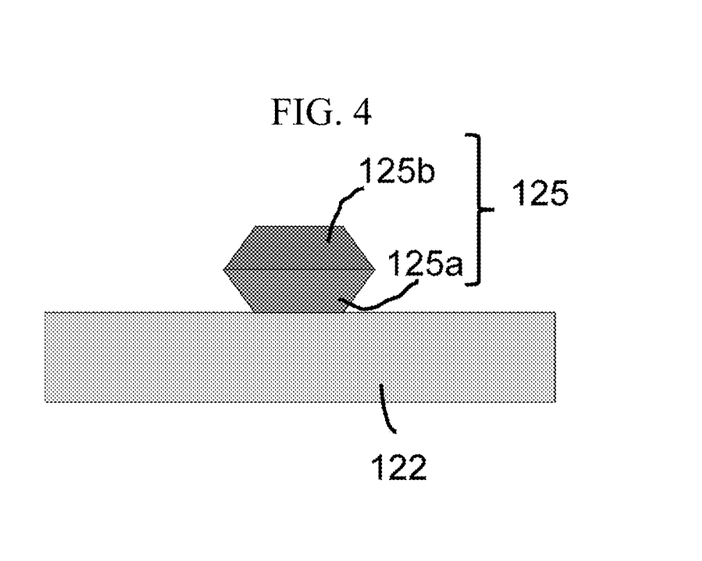
FIG. 4 is a cross-sectional view illustrating a bank and a spacer of an organic light emitting display device in accordance with an embodiment of the present invention.

FIG. 4 is a cross-sectional view illustrating the bank and the spacer of the organic light emitting display device in accordance with an embodiment of the present invention.

As illustrated in FIG. 4, the spacer 125 on the bank is formed having a bi-level structure. The first layer 125a of a lower part of the spacer 125 is formed of a first photoreactive negative photo acryl while having a negative tapered shape. In addition, the second layer 125b of an upper part of the spacer 125 is formed of a second photoreactive negative photo acryl having a greater photoreactivity than a photoreactivity of the first layer 125a while having a positive tapered shape. The first and second layers 125a and 125b are defined to have different shapes by one exposure because of different photoreactivity. Furthermore, because the first and second layers 125a and 125b are formed of negative photo acryl, a part receiving light remains. An edge part of one of the first and second layers 125a and 125b is has a different shape than an edge part of the other one of the first and second layers 125a and 125b due to different profiles of light exposure.

Meanwhile, the first electrode 121 is a reflective electrode, and the second electrode 124 is a transparent electrode. When external light is incident, external light passes through the organic light display OLED and is reflected at the first electrode 121. Upon reflection, external light passes through the transparent second electrode 124. In addition, an encapsulating layer 140 is formed on the organic light emitting display array 120 to cover an upper part and a side part of the organic light emitting display OLED.

A polarizing plate is formed at an outermost layer of the organic light emitting display device to prevent visibility of external light. For example, as illustrated, an organic light emitting display device is used as the display device. However, another panel may adhere to an upper part of the encapsulating layer 140 in which a separate adhesion layer is interposed between another panel and the encapsulating layer 140. For example, a touch sensing array panel may be used as the adhered panel. In this case, the polarizing plate is included in the touch sensing array panel or is included at the outermost touch sensing array panel.

Meanwhile, the substrate 100 may include at least one polymeric compound selected from a group consisting of polyester or a copolymer including polyester, polyimide or a copolymer including polyimide, an olefin copolymer, polyacrylic acid or a copolymer including polyacrylic acid, polystyrene or a copolymer including polystyrene, polysulfate or a copolymer including polysulfate, polycarbonate or a copolymer including polycarbonate, polyamic acid or a copolymer including polyamic acid, polyamine or a copolymer including polyamine, polyvinyl alcohol, and poly(allyamine). A thickness of the substrate 100 may be 5 μm to 100 μm. This allows the organic light emitting display device to be folded and to be flexible. When the touch sensing array panel is added, the touch sensing array panel may be formed of the same material as the substrate 100 or be formed of a material similar to the substrate 100. Furthermore, in a top emission configuration, the substrate 100 may use a colored material.

Meanwhile, as illustrated, the organic layers 123 including the organic light emitting layers may be spaced from one another in each pixel with respect to the spacer 125. Particularly, in the organic layers 123, the organic light emitting layers between the first and second electrodes 121 and 124 are spaced from each other with respect to the pixels to prevent color mixing and to independently drive color with respect to the pixels. The organic layer 123 may be formed by the same deposition mask as the organic light emitting layer. Alternatively, the organic light emitting layer may use the deposition mask and the remaining organic layer may be entirely deposited without the deposition mask. However, in any case, when the spacer 125 has the negative tapered lower part and the positive tapered upper part, and the organic layer 123 is deposited, there is interference between an opening of the deposition mask and the edge part of the spacer 125. Although the organic material corresponds to the edge part of the spacer 125, the first layer 125a of the spacer 125 has a negative tapered shape such that the organic materials may be accumulated at the negative tapered first layer 125a and may be spaced with respect to the pixels. Thus, color mixing due to overlapping of the organic light emitting materials between the pixels may be prevented.

Furthermore, because the second layer 125b, which is the upper layer of the spacer 125, has a positive tapered shape, when the deposition mask of the organic material is in contact with a surface of the second layer 125b, the contact area is small. Therefore, particles generated at the contact area may be significantly reduced and the organic layer 123 including the organic light emitting layer adjacent to the first layer 125a may be protected.

In addition, because the spacer 125 has a bi-level structure, when an external force is applied, such as when the device is folded, the force is dispersed by a forming unit of the spacer 125. Thus, the device has an increased tolerance to folding. As a result, lighting defects due to repeated folding and unfolding motions may be prevented.

Furthermore, because the second layer 125b disposed at the upper part of the spacer 125 has a positive tapered shape and the first layer 125a disposed at the lower part of the spacer 125 has a negative tapered shape, the organic material is separated between the first and second layers 125a and 125b even after deposition of the organic material. At the same time, an inside of the negative tapered first layer 125a has high adhesion of the organic material, thereby being stable upon repeated folding and unfolding motions functioning as external force. That is, when the organic material is entirely deposited and folding motions are performed, detachment of the organic material occurs at a part to which external force is locally applied and detachment is spread. However, because the organic layers including each organic light emitting layer are separately disposed at the inside of the negative tapered first layer 125a such that detachment of a part of the organic material does not affect the entire panel. Accordingly, as adhesion of the organic material for each pixel is increased, the organic light emitting display device is stable in spite of repeated folding and unfolding motions.

Meanwhile, as illustrated, the pixels may be arranged in a diagonal direction of the substrate. Furthermore, each pixel may have a rhombus shape. The pixels may have different sizes with respect to the colors of the organic light emitting layers.

The sizes of the light emitting layers may be variable according to luminous efficacy. The organic light emitting layer having low luminous efficacy is formed to be a large pixel and the organic light emitting layer having high luminance efficacy is formed to be a small pixel. The size of each organic light emitting layer may be determined by the bank.

Hereinafter, a method of manufacturing the organic light emitting display device will be explained.

Figure 5:
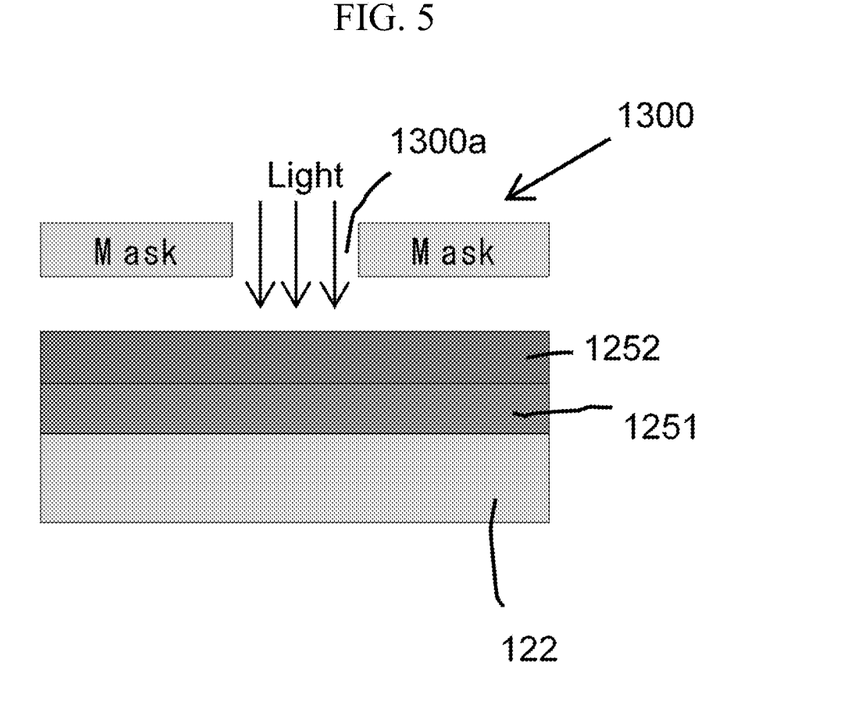
FIG. 5 is a cross-sectional view illustrating a material and a mask used to form the spacer of FIG. 4.
Figure 6A:
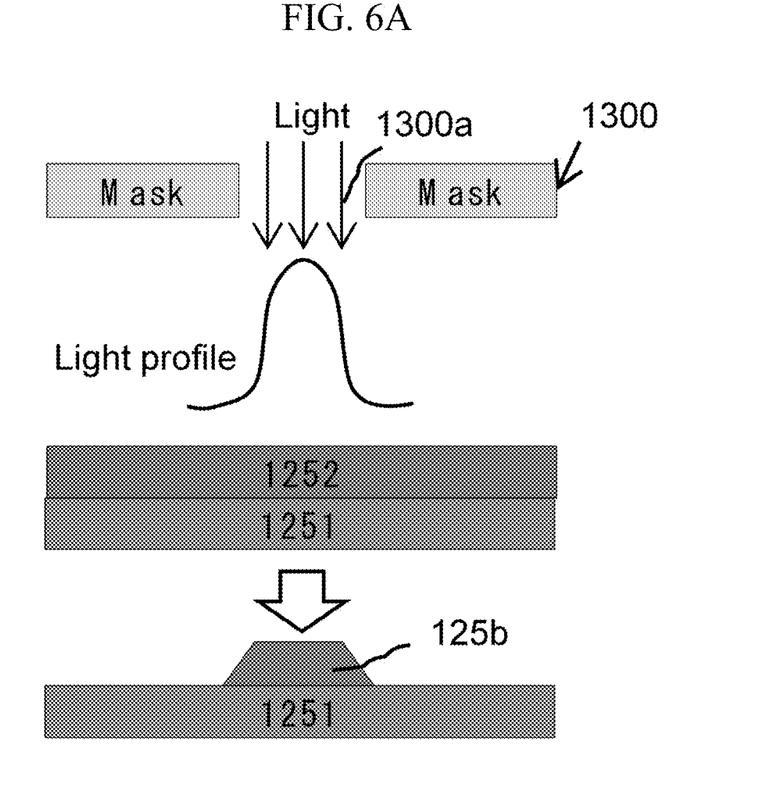
FIGS. 6A and 6B are cross-sectional views illustrating the photoreactivity of the first and second layers constituting the spacer with respect to the same mask upon formation of the spacer of an embodiment of the present invention.
Figure 6B:
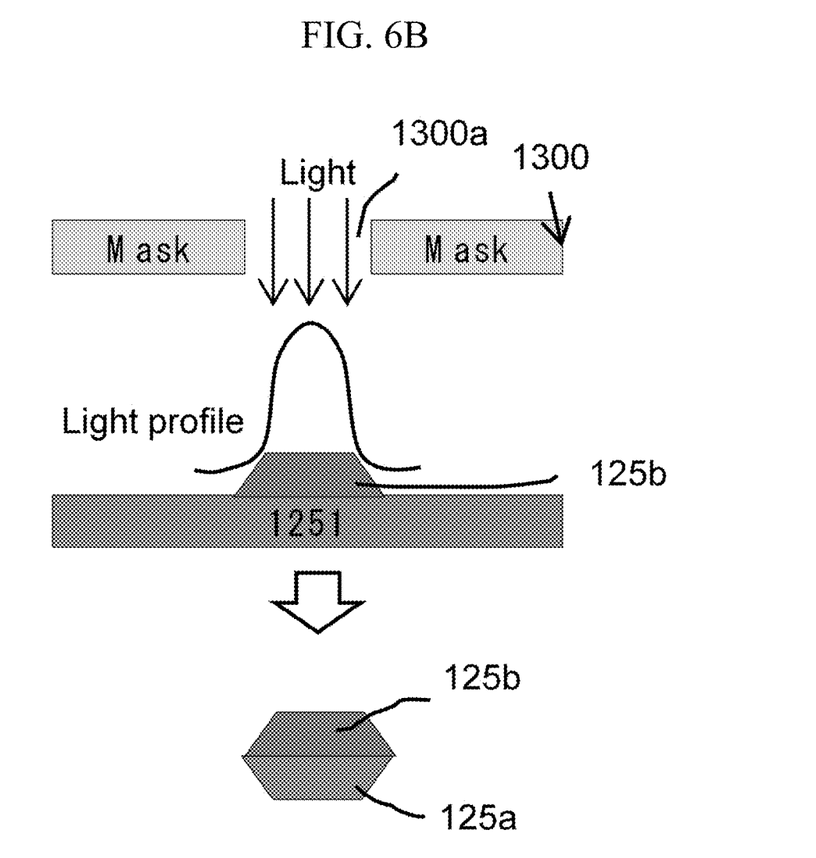
Figure 7A:
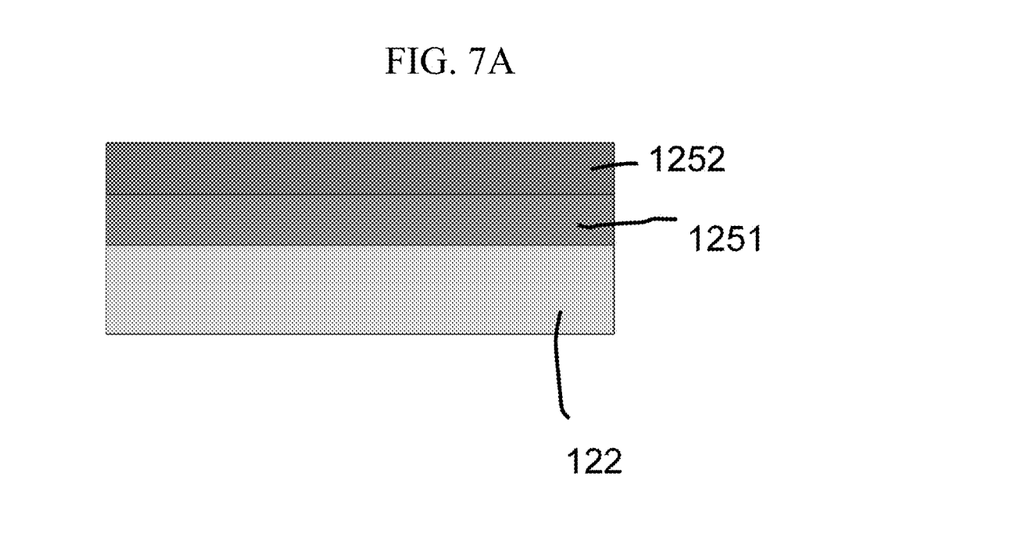
FIGS. 7A to 7C are cross-sectional views illustrating a method of manufacturing the spacer of an embodiment of the present invention.
Figure 7B:
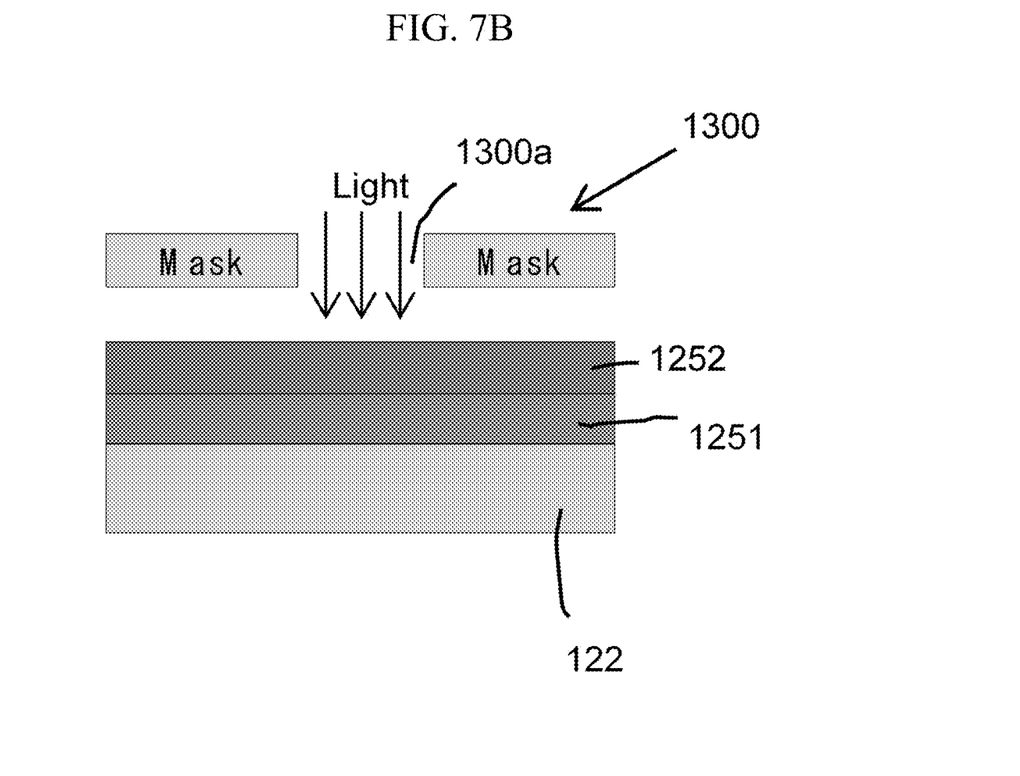
Figure 7C:
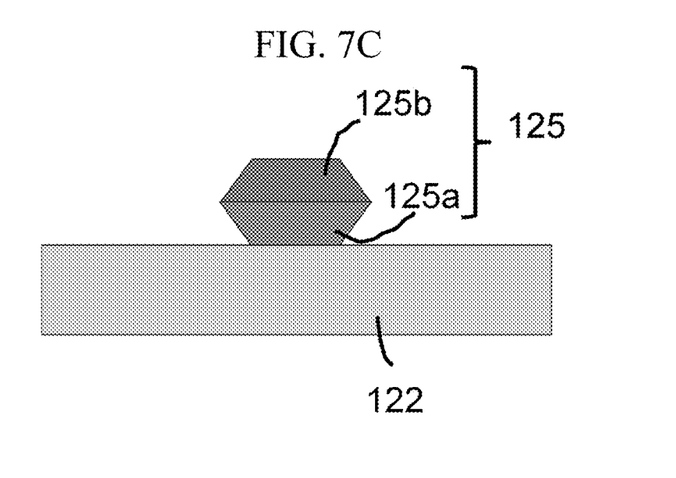

FIG. 5 is a cross-sectional view illustrating a material and a mask used to form the spacer of FIG. 4. FIGS. 6A and 6B are cross-sectional views illustrating photoreactivity of the first and second layers constituting the spacer with respect to the same mask upon formation of the spacer of an embodiment of the present invention. FIGS. 7A to 7C are cross-sectional views illustrating a method of manufacturing the spacer in accordance with an embodiment of the present invention.

As illustrated in FIGS. 5 and 7A, first, a first layer 1251 formed of a first photoreactive negative photo acryl and a second layer 1252 formed of a second photoreactive negative photo acryl having greater photoreactivity than the first layer 1251 are sequentially deposited on the bank 122.

Then, as illustrated in FIG. 7B, the negative tapered first layer 125a and the positive tapered second layer 125b on the first layer 125a are simultaneously formed using a mask 1300 having an opening 1300a exposing a certain part on the bank 122 while being disposed above the second layer 1252, thereby forming the spacer 125.

Herein, when there is the opening 1300a of the general mask 1300, exposure is performed through the opening 1300a. Intensity of light passing through a central part of the opening 1300a is high and intensity of light passing through an edge part of the opening 1300a is low. Thus, a photoresist material corresponding to the opening 1300a of the mask 1300 is exposed. A final pattern shape is variable according to photoreactivity of the photoresist material.

When the spacer is manufactured, a negative photoresist material where an exposed part remains is used for the first and second layers 1251 and 1252. As illustrated in FIGS. 5A and 5B, the first layer 1251 is formed of a low photoreactive negative photoresist material and the second layer 1252 is formed of a high photoreactive negative photoresist material such that the first and second layers 1251 and 1252 may have different tapered shapes after exposure. That is, the lower first layer 1251 has a negative tapered shape after exposure and the upper second layer 1252 has a positive tapered shape after exposure such that stress may be reduced upon folding motions and the defects due to the particles may be prevented upon deposition of the organic material because a contact area between the spacer and the deposition mask is reduced.

Particularly, the negative photoresist material of the spacer 125 may include negative photo acryl. For example, the high photoreactive second layer 1252 may use HDN-300 and the low photoreactive first layer 1251 may use ZPN-2464.

After exposure, as illustrated in FIG. 6C, the first and second layers 1251 and 1252 are patterned such that the first and second layers 125a and 125b have a negative tapered shape and a positive tapered shape, respectively. The spacer 125 includes the first and second layers 125a and 125b.

Figure 8:
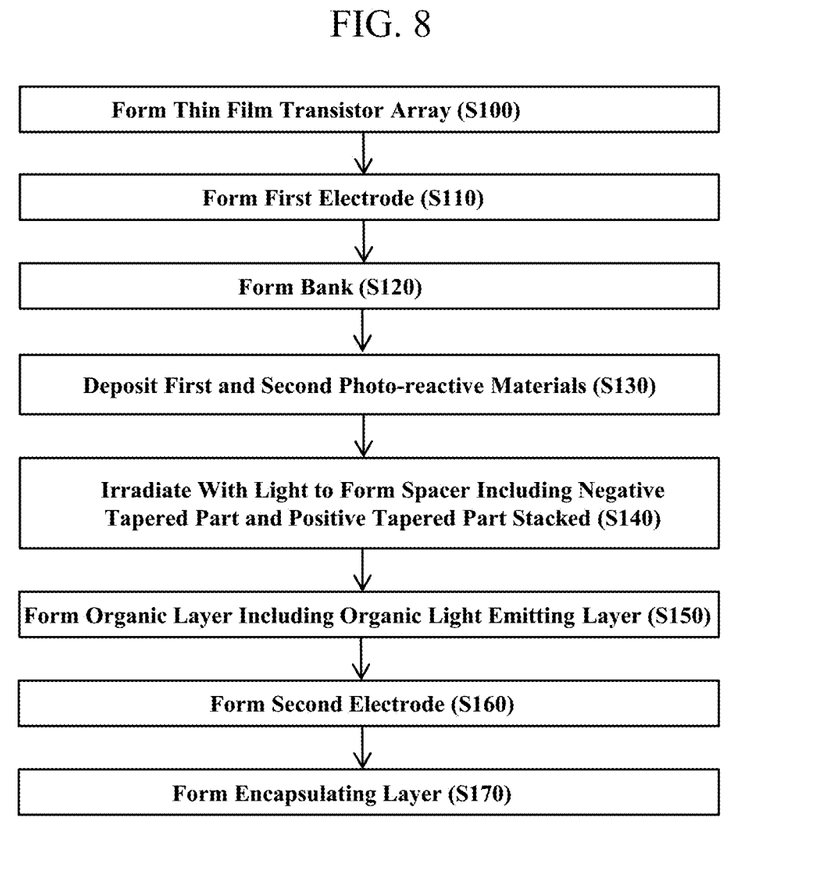
FIG. 8 is a flowchart of the organic light emitting display device in accordance with an embodiment of the present invention.

FIG. 8 is a flowchart illustrating a method of manufacturing the organic light emitting display device in accordance of an embodiment of the present invention. With reference to FIGS. 3 and 8, the method of manufacturing the organic light emitting display device will be explained.

First, the substrate 100 having a flexible material is formed on a glass substrate (not shown). The thin film transistor array 110 including at least two thin film transistors and at least one capacitor as illustrated in FIG. 3 at each of the plural pixels that are arranged in a matrix is formed (S100).

Then, the first electrode 121 connected to a driving thin film transistor disposed at each pixel of the thin film transistor array 110 is formed (S110). Sequentially, the bank 122 defining a formation area of the organic light emitting layer is formed at a boundary of each pixel (S120).

As illustrated in FIG. 6A, the first layer 1251 formed of the first photoreactive negative photo acryl and the second layer 1252 formed of the second photoreactive negative photo acryl having greater photoreactivity than the first layer 1251 are sequentially deposited on the bank 122 (S130).

As illustrated in FIG. 6B, the mask having the opening exposing the certain portion of the second layer 1252 corresponding to the bank 122 is disposed above the second layer 1252. As illustrated in FIG. 6C, the second layer 1252 is exposed using the mask such that the first layer 125a having the negative tapered shape and the second layer 125b having the positive tapered shape on the first layer 125a are simultaneously formed to form the spacer 125 (S140).

Then, the organic layer 123 including the organic light emitting layer is formed on the bank 122 and the first electrode 121 (S150). Subsequently, the second electrode 124 is formed on the bank 122, the spacer 125 and the organic layer 123 (S160). The encapsulating layer 140 is formed at the entire second electrode 124 to complete a process of the organic light emitting display device.

As described, a spacer of an organic light emitting display device in accordance with example embodiments of the present invention is formed with a bi-level structure having different tapered shapes. In detail, after the materials having different photoreactivity are deposited, one exposure is performed to form the spacer, thereby reducing the number of masks. Because the upper part of the spacer has the positive tapered shape, the contact area between the spacer and the deposition mask may be reduced, thereby reducing the particles. At the same time, because the lower part of the spacer has a negative tapered shape, detachment of the organic material during repeated folding and unfolding motion may be reduced.

As is apparent from the above description, according to example embodiments of the present invention, there are advantages such as those discussed below.

First, the shape of the spacer on the bank is changed to prevent the metallic mask from directly affecting the pixel area upon deposition of the organic material.

Second, the spacer has a positive tapered upper part to reduce the contact area of the deposition mask, thereby preventing the defects due to the particles. At the same time, the spacer has a negative taper lower part to prevent detachment of the organic material due to repeated folding and unfolding motion.

Third, after the negative photoresist materials having different photoreactivity are deposited to have a bi-level structure, one exposure is performed to form the spacer having the bi-level structure which has different tapered shapes. As a result, a number of masks may be reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing an organic light emitting display device, comprising:
    providing a substrate including a plurality of pixels defined thereon;
    forming a first electrode at each pixel;
    forming a bank exposing the first electrode of each pixel;
    sequentially depositing, on the bank, a first layer of a first negative photoreactive acryl and a second layer of a second negative photoreactive acryl having a greater photoreactivity than a photoreactivity of the first negative photoreactive acryl;
    forming a spacer including the first layer having a negative taper and the second layer having a positive taper by applying a mask over the second layer, the mask having an open portion to open a predetermined portion of the bank;
    forming an organic layer including an organic light emitting layer on the bank and the first electrode; and
    forming a second electrode on the bank, the spacer, and the organic layer.

2. The method according to claim 1, wherein the organic layer includes a plurality of organic light emitting layers that are respectively disposed at each pixel to be spaced from each other with respective spacers therebetween.

3. The method according to claim 1, wherein the pixels are arranged in a diagonal direction on the substrate.

4. The method according to claim 3, wherein each pixel has a rhombus shape, and wherein the pixels have sizes that differ according to colors of the respective organic light emitting layers.

* * * * *